United States Patent [19]

Kipnis

[11] Patent Number: 4,769,621

[45] Date of Patent: Sep. 6, 1988

[54] FREQUENCY DIVIDER WITH DARLINGTON TRANSISTORS

[75] Inventor: Issy Kipnis, Berkeley, Calif.

[73] Assignee: Avantek, Inc., Santa Clara, Calif.

[21] Appl. No.: 86,712

[22] Filed: Aug. 18, 1987

Related U.S. Application Data

[63] Continuation-in-part of Ser. No. 846,756, Apr. 1, 1986, Pat. No. 4,688,005.

[51] Int. Cl.[4] .................... H03B 5/00; H03B 21/01
[52] U.S. Cl. .................... 331/117 R; 331/37; 455/323
[58] Field of Search .................... 331/37, 42, 47, 50, 331/51, 52, 53, 55, 108 C, 117 R, 117 D, 172; 455/318, 323, 325, 333

[56] References Cited

U.S. PATENT DOCUMENTS 3,882,422  5/1975  Freed .................... 331/117 R X

Primary Examiner—Eugene R. Laroche
Assistant Examiner—David Mis
Attorney, Agent, or Firm—Limbach, Limbach & Sutton

[57] ABSTRACT

A frequency divider is disclosed that includes two bipolar transistors coupled as a Darlington pair, where the base of the first transistor receives an input signal to be divided, and where the common collectors of the transistors generate an output signal having a frequency equal to one-half or other integer submultiple of the input signal. The frequency divider also includes a feedback network operable for coupling a portion of the output signal from the output side of the transistors to the input side of the transistors. Such a frequency divider can provide signal conversion gain at microwave frequencies.

7 Claims, 1 Drawing Sheet 4,769,621

FREQUENCY DIVIDER WITH DARLINGTON TRANSISTORS

RELATED PATENT APPLICATION

This is a continuation-in-part of co-pending patent application Ser. No. 846,756 filed Apr. 1, 1986, which is now U.S. Pat. No.4,688,005.

BACKGROUND OF THE INVENTION

1. Field of the Invention

This invention relates generally to frequency divider circuits, and relates more particularly to a regenerative frequency divider having Darlington-connected transistors.

2. Description of the Relevant Art

A regenerative frequency divider includes four functional elements: a mixer, a filter, an amplifier, and a feedback network, some of which may be combined into a single physical element. The mixer, filter, and amplifier are coupled between an input port and an output port, while the feedback network is coupled between the output port of the amplifier and an input port of the mixer. An input signal having a frequency f is supplied to the mixer, which mixes the input signal with a signal from the feedback network and generates the corresponding frequency products. The output of the mixer is filtered and amplified to generate an output signal, which is also fed back through the feedback network to the mixer.

If a signal having a frequency of f/2 exists in the feedback loop, then the frequency products generated by the mixer will include the frequencies f/2, f, 3f/2, etc. The higher harmonics are filtered out by the filter and the remaining f/2 signal is amplified by the amplifier and fed back to the mixer through the feedback network. If the open-loop gain at the frequency of the f/2 subharmonic is greater than 1.0 when the input signal is applied, then the f/2 signal will be sustained in the loop. The frequency divider thus generates an output signal at one-half the frequency of the input signal.

Frequency division by integers other than 2, such as 3 or 4, is also possible, provided that the input signal is strong enough and the output frequency is within the operational band of the divider. For example, a divider having a nominal input frequency of 5.0 GHz for divide by 2 operation, will have a nominal input frequency of 7.5 GHz for operation as a divide by 3 circuit and a nominal input frequency of 10.0 GHz for operation as a divide by 4 circuit. As the divide number increases, the input signal bandwidth for proper operation at that divide number will typically decrease.

Prior implementations of a regenerative frequency divider have used either discrete or integrated components. Some prior implementations have used a single silicon bipolar transistor or GaAs field-effect transistor as a mixing/filtering/amplifying element of the divider.

SUMMARY OF THE INVENTION

In accordance with the illustrated preferred embodiment, the present invention provides a regenerative frequency divider having Darlington-connected transistors and a feedback network. The frequency divider receives an input signal and, in response, generates an output signal having a frequency of an integer sub-multiple (such ½, ⅓, or ¼) of the input signal. The frequency divider includes two silicon bipolar transistors coupled as a Darlington pair, where the base of the first transistor receives the input signal, and where the common collectors of the transistors generate the output signal; and a feedback network operable for coupling a portion of the output signal from the output side of the transistors to the input side of the transistors.

The Darlington-connected transistors perform three functions: mixing, filtering, and amplifying. The transistors mix the input and feedback signals, filter out the higher harmonics from the mixed signal to obtain the f/2 signal, and amplify the resulting f/2 signal. The first transistor generates the frequency products, while the second transistor acts as an amplifier. Since the two transistors are separately biased, the performance of each transistor can be separately optimized.

The feedback network in conjunction with the capacitance of the Darlington-connected transistors serve as a bandpass resonator to feed a portion of the f/2 output signal back to the input side of the transistors. Preferably, although not necessarily, the resonator is an LC resonator, where the C is provided by the transistors.

The frequency divider of the present invention provides several advantages over prior art frequency dividers based on single transistors. One advantage is the high frequency gain of the Darlington-connected transistors, which extends the upper frequency limit of operation of the frequency divider. Another advantage is the lower reflection coefficient, which facilitates the matching of the device and operation over a broader frequency band. Another advantage is that the Darlington pair has a sharper rate of cutoff than a single device, thus providing a better filtering function. A further advantage is relatively low cost, which results from the combination of the mixing, filtering, and amplifying functions into a single device, and from the use of silicon, rather than gallium arsenide, transistors. An important feature of the frequency divider of the present invention is its ability to handle input frequencies in excess of 20 GHz.

The features and advantages described in the specification are not all inclusive, and particularly, many additional features and advantages will be apparent to one of ordinary skill in the art in view of the drawings, specification and claims hereof. Moreover, it should be noted that the language used in the specification has been principally selected for readability and instructional purposes, and may not have been selected to delineate or circumscribe the inventive subject matter, resort to the claims being necessary to determine such inventive subject matter.

DETAILED DESCRIPTION OF THE PREFERRED EMBODIMENT

Figure 1:
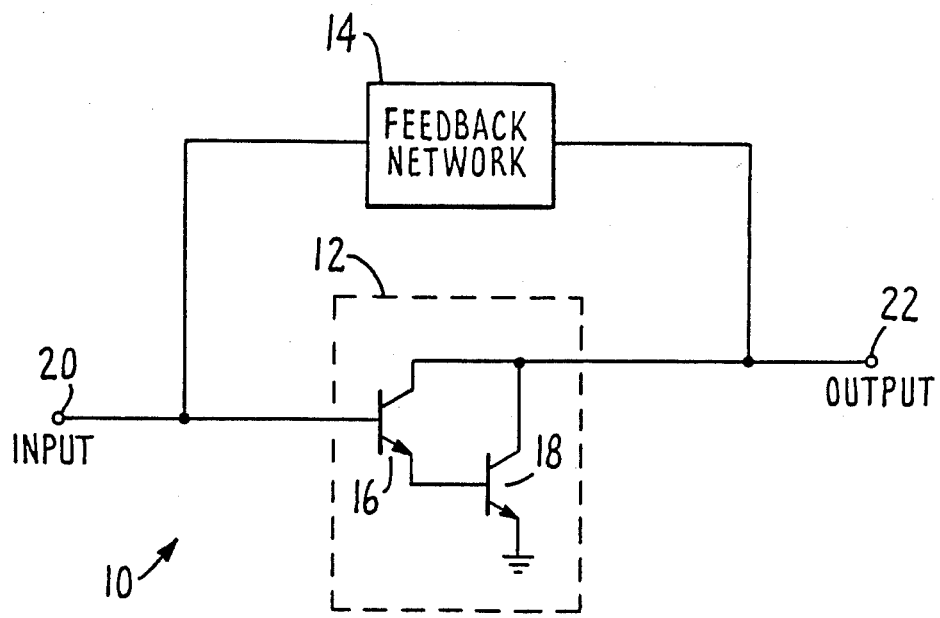
FIG. 1 is a block diagram of a regenerative frequency divider according to the present invention.
Figure 2:
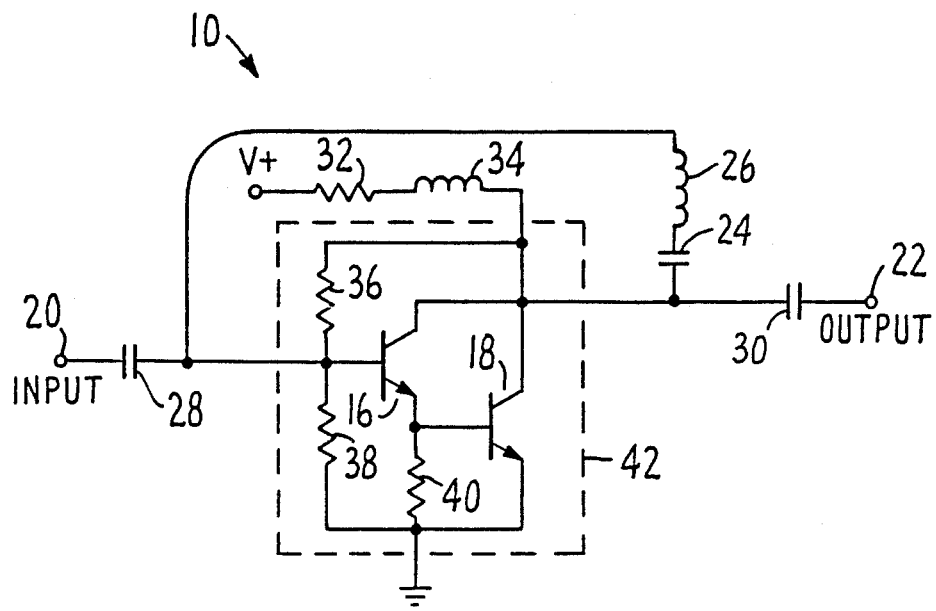
FIG. 2 is a schematic circuit diagram of the preferred embodiment of the frequency divider of FIG. 1.

FIGS. 1 and 2 of the drawings depict the preferred embodiment of the present invention for purposes of illustration only. One skilled in the art will readily recognize from the following discussion that alternative embodiments of the structures and methods illustrated herein may be employed without departing from the principles of the invention described herein.

As shown in FIG. 1, the preferred embodiment of the present invention is a frequency divider 10 with Darlington-connected transistors 12 and a feedback network 14. The Darlington-connected transistors 12 consist of two bipolar transistors 16 and 18, with the emitter of the first transistor 16 connected to the base of the second transistor 18. The base of the first transistor 16 is coupled to an input port 20, and the collectors of the two transistors 16 and 18 are connected in common to an output port 22. A signal to be divided and having a frequency f is supplied to the input port 20, while the resulting output signal, having an output frequency of f/2 (or other sub-multiple of f), is available at the output port 22. The input and output ports 20 and 22 are coupled to the transistors 12 through coupling capacitors 28 and 30, respectively.

The feedback network 14 is coupled between the output side and the input side of the Darlington-connected transistors 12. The feedback network 14 forms a feedback loop that feeds back to the base of the first transistor 16 a portion of the f/2 output signal. In conjunction with the transistors, the feedback network 14 also serves as a filter. The inherent capacitance of the Darlington transistors 12 plus the circuitry of the feedback network 14 combine to provide a bandpass resonator having a pass bandwidth that includes the frequency of the output signal.

Although the feedback network 14 can be any of a wide range of resonant devices, preferably the feedback network is a series connected capacitor 24 and inductor 26, as shown in FIG. 2. Such an arrangement provides a relatively low Q resonant structure, which is needed in order to provide a broad input-signal bandwidth for proper operation as a divider. Alternatively, the feedback network could be a high Q resonant structure, such as a dielectric resonator disposed between one microstrip line coupled to the output port and another microstrip line coupled to the input port. Or, a microstrip line resonator plus a capacitor in series could be used as the feedback network. In general, the feedback network can be any of a number of band-pass or low-pass filter networks having LC or microstrip line components.

The component values of capacitor 24 and inductor 26 are sized according to different reasons. Preferably, the capacitance of capacitor 24 is chosen to be large so that it serves only as a DC blocking capacitor and does not contribute to the AC response of the bandpass resonator formed by the feedback network 14 in combination with the transistors 12. The inductance of the inductor 26 is chosen so that, in combination with the inherent capacitance of the Darlington transistors 12, the resulting bandpass resonator has the desired pass frequency or frequency band.

As shown in FIG. 2, the preferred embodiment of the regenerative frequency divider 10 is powered by a source of positive voltage, V+, which is supplied to the common collectors of the transistors 12 through a resistor 32 and an inductor 34. The transistors 16 and 18 are biased by resistors 36, 38, and 40. Resistors 36 and 38 are coupled between the common collectors and ground, while resistor 40 is coupled between ground and the common connection between the emitter of transistor 16 and base of transistor 18. These separate biasing resistors provide biasing means for separately biasing the two transistors 16 and 18, so that the performance of each transistor can be independently adjusted. Preferably, the Darlington-connected transistors 12 and their bias circuitry are fabricated as a monolithic integrated circuit 42. Also preferably, the transistors 16 and 18 are NPN bipolar transistors fabricated in silicon. Such devices are available, for example, from Avantek, Inc. of Santa Clara, Calif.

In operation, an input signal supplied to the input port 20 is mixed with the output of the feedback network 14 by the first transistor 16. The first transistor 16 forms the frequency products of the two signals, and the second transistor 18 amplifies those frequency products. The frequency products occur at frequencies equal to the sums and differences of the frequencies of the input signal, the feedback signal, and their multiples.

The Darlington-connected transistors 12 of the frequency divider 10 permit operation at higher frequencies than does a single bipolar transistor device because the Darlington-connected transistors 12 provide a current or power gain at relatively higher frequencies than do single transistor devices, so that any gain limiting conditions of operation are reached at higher frequencies.

The maximum output frequency of the frequency divider 10 is a function of the gain of the transistors 12 and the losses of the feedback network 14. In order for the frequency divider 10 to operate, the open loop gain of the frequency divider, with the input signal applied, must be not less than unity, where the open loop gain is the current gain of the transistors 12 times the current loss of the feedback network 14. If the open loop gain falls below unity, the feedback signal will stop circulating through the loop formed by the transistors 12 and the feedback network 14. The current gain of the transistors 12 is, therefore, a determining factor of the maximum output frequency. High performance NPN transistors having cut-off frequencies of about 10 GHz have been successfully used in a regenerative frequency divider 10 to provide a maximum output frequency of about 10 GHz, which is one-half the frequency of an input signal of about 20 GHz. While PNP transistors can also be used as the Darlington-connected transistors 12, at the present time NPN transistors typically have higher cut-off frequencies than do PNP transistors, and for that reason, NPN transistors are preferred.

The operational frequency bandwidth of the frequency divider 10 is influenced by the resonant frequency of the bandpass resonator formed by the feedback network 12 and the transistors 14. In the FIG. 2 embodiment, the resonant frequency of the bandpass resonator is inversely proportional to the square root of the product of the inductance (L) of inductor 26 and the capacitance (C) between the input and output ports of the transistors 12, assuming that capacitor 24 is large and has little influence on the AC response of the resonator. Thus, increasing L or C decreases the center frequency of the bandpass resonator, while decreasing L or C has the opposite effect. The bias conditions of the transistors 12 can influence the value of C.

A frequency divider 10 has been built to the following specifications: Avantek MSF-8885 silicon bipolar MMIC amplifier used for the Darlington-connected transistors 12 and bias circuit; capacitor 24 at 45 pf; and inductor 26 at 6.0 nH. With a bias current of about 40 ma through resistor 32 and inductor 34, the transistors 12 have an inherent capacitance of about 0.6 pf. The resonator has a resonant frequency of 3.0 GHz, while the divider as a whole has an input bandwidth for divide by 2 operation of 3.6 to 6.2 GHz, based on an input power of +13 dBm.

From the above description, it will be apparent that the invention disclosed herein provides a novel and advantageous frequency divider with Darlington-connected transistors and a feedback network. The foregoing discussion discloses and describes merely exemplary methods and embodiments of the present invention. As will be understood by those familiar with the art, the invention may be embodied in other specific forms without departing from the spirit or essential characteristics thereof. For example, silicon PNP bipolar transistors or gallium arsenide bipolar transistors can be substituted for the preferred silicon NPN bipolar transistors 16 and 18. Also, the feedback network need not be a series LC circuit. Accordingly, the disclosure of the present invention is intended to be illustrative, but not limiting, of the scope of the invention, which is set forth in the following claims.

What is claimed is:

1. A regenerative frequency divider comprising:
   an input port operable for receiving an input signal;
   an output port operable for supplying an output signal having a frequency substantially equal to an integer sub-multiple of the frequency of the input signal;
   first and second silicon bipolar transistors coupled as a Darlington pair, wherein the base of said first transistor is coupled to said input port, and wherein the common collectors of said transistors are coupled to said output port; and
   feedback means for coupling a portion of the output signal from said common collectors to the base of said first transistor.

2. A frequency divider as recited in claim 1 wherein said transistors have an inherent capacitance existing between the base of said first transistor and said common collectors, wherein said feedback means in combination with the inherent capacitance of said transistors forms a bandpass resonator coupled between said common collectors and the base of said first transistor, and wherein the frequency of the output signal is within the pass-band of said bandpass resonator.

3. A frequency divider as recited in claim 1 wherein said feedback means includes a capacitor and inductor connected in series between said common collectors and the base of said first transistor.

4. A frequency divider as recited in claim 1 wherein said first and second bipolar transistors comprise NPN transistors.

5. A frequency divider as recited in claim 1 further comprising biasing means for biasing said transistors.

6. A frequency divider as recited in claim 5 wherein said transistors and said biasing means are fabricated as a monolithic integrated circuit.

7. A regenerative frequency divider comprising:
   an input port operable for receiving an input signal;
   an output port operable for supplying an output signal having a frequency substantially equal to an integer sub-multiple of the frequency of the input signal;
   first and second silicon NPN transistors coupled as a Darlington pair, wherein the base of said first transistor is coupled to said input port, and wherein the common collectors of said transistors are coupled to said output port;
   means for biasing said transistors, wherein said transistors and said biasing means are fabricated as a monolithic integrated circuit; and
   feedback means for coupling a portion of the output signal from said common collectors to the base of said first transistor, wherein said feedback means includes a capacitor and inductor connected in series between said common collectors and the base of said first transistor.

* * * * *